US006091269A

United States Patent [19]

Rossum

[11] Patent Number: 6,091,269

[45] Date of Patent: Jul. 18, 2000

[54] METHOD AND APPARATUS FOR CREATING DIFFERENT WAVEFORMS WHEN SYNTHESIZING MUSICAL SOUNDS

[75] Inventor: David P. Rossum, Aptos, Calif.

[73] Assignee: Creative Technology, Ltd., Singapore

[21] Appl. No.: 08/682,383

[22] Filed: Jul. 17, 1996

Related U.S. Application Data

[63] Continuation of application No. 08/418,518, Apr. 7, 1995, abandoned.

[51] Int. Cl.[7] .................. H03B 21/00

[52] U.S. Cl. .................. 327/107; 327/100; 327/603; 84/622; 84/624; 364/718.02

[58] Field of Search .................. 327/231, 105, 327/113, 116, 119, 356, 106, 107; 84/602, 603, 604, 605, 607, 624, 627; 364/718, 721

[56] References Cited

U.S. PATENT DOCUMENTS

| | | | |
|---|---|---|---|
| Re. 34,481 | 12/1993 | Ishibashi | 84/605 |
| 3,515,039 | 6/1970 | Omura et al. | 84/675 |
| 3,534,144 | 10/1970 | Ring | 84/660 |

(List continued on next page.)

FOREIGN PATENT DOCUMENTS

| | | |
|---|---|---|
| 0454047 | 10/1991 | European Pat. Off. . |
| 0484048 | 5/1992 | European Pat. Off. . |
| 2103005 | 2/1983 | United Kingdom . |
| WO 95/06859 | 3/1995 | WIPO . |

OTHER PUBLICATIONS

Alles, H.G., et al., "A–One Card 64 Channel Digital Synthesizer," *Computer Music Journal* (1977) 1(3):7–9.

Bate, John A., "The Effect of Modulator Phase on Timbres in FM Synthesis," *Computer Music Journal* (1990) 14(3):38–45.

Chowning, John M., "The Synthesis of Complex Audio Spectra by Means of Frequency Modulation," *Journal of the Audio Engineering Society* (1973) 21(7):526–35 (reprinted in *Computer Music Journal* (1977) 1(2):46–54).

Holm, Frode, "Understanding FM Implementations: A Call for Common Standards," *Computer Music Journal* (1973) 16(1):34–42.

Hutchins, Bernie, "Some Additional VCO Design Problems and Solutions: (E) Adding Linear FM," *Electronotes Newsletter* (1975) 7(49):6–7.

Hutchins, Bernie, "The ENS–76 Home–Built Synthesizer System—Part 7, VCO Options, Option 3," *Electronotes Newsletter* (1977) 9(75):14–16.

(List continued on next page.)

*Primary Examiner*—Timothy P. Callahan
*Assistant Examiner*—Kenneth B. Wells
*Attorney, Agent, or Firm*—Morrison & Foerster

[57] ABSTRACT

A circuit and method for generating waveforms when synthesizing musical sounds. In one embodiment, the invention provides a multiplexer/shifter which modifies the phase angle input according to the particular waveform desired. Boolean logic gates further modify the multiplexer/shifter output based on the two most significant bits of the phase angle input and according to the particular waveform desired. Finally, a multiplier multiplies the multiplexer/shifter output with the output of the Boolean logic gates to produce the desired waveform. The invention may employ banks of exclusive OR gates and AND gates as the Boolean logic. Another embodiment of the invention provides a waveshaping method where a desired waveform is generated from a phase angle input. The phase angle input is multiplexed/shifted based on the particular waveform desired. The results of the multiplexing/shifting are then modified by Boolean logic gates, based on the two most significant bits of the phase angle input and according to the particular waveform desired. The results of the multiplexing/shifting and the Boolean logic are then multiplied together to produce the desired waveform.

16 Claims, 5 Drawing Sheets

U.S. PATENT DOCUMENTS

| | | | |
|---|---|---|---|
| 3,649,821 | 3/1972 | Gumacos | 364/718 |
| 3,888,153 | 6/1975 | Deutsch | 84/625 |
| 3,979,991 | 9/1976 | Kawamoto | 84/706 |
| 4,018,121 | 4/1977 | Chowning | 84/696 |
| 4,130,876 | 12/1978 | Mitsuhashi | 327/105 |
| 4,135,422 | 1/1979 | Chibana | 84/607 |
| 4,175,464 | 11/1979 | Deutsch | 84/623 |
| 4,259,888 | 4/1981 | Gross | 84/627 |
| 4,297,933 | 11/1981 | Nishimoto | 84/607 |
| 4,318,045 | 3/1982 | Krupa et al. | 327/105 |
| 4,343,128 | 8/1982 | Mena | 53/167 |
| 4,453,869 | 6/1984 | Cremieux | 411/138 |
| 4,554,858 | 11/1985 | Wachi et al. | 84/622 |
| 5,113,740 | 5/1992 | Saito | 84/607 |
| 5,117,725 | 6/1992 | Takauji et al. | 84/605 |
| 5,136,917 | 8/1992 | Kunimoto | 84/624 |
| 5,157,215 | 10/1992 | Nakae et al. | 84/624 |
| 5,187,677 | 2/1993 | Kovalick | 364/721 |
| 5,223,653 | 6/1993 | Kunimoto et al. | 84/624 |
| 5,223,656 | 6/1993 | Higashi | 84/661 |
| 5,243,658 | 9/1993 | Sakata | 381/62 |
| 5,298,676 | 3/1994 | Sasaki et al. | 84/624 |
| 5,308,918 | 5/1994 | Yamauchi et al. | 84/622 |

OTHER PUBLICATIONS

Matthews, Max V., The Technology Of Computer Music, (M.I.T. Press 1969) pp. 48–53, 76–18 and 134–138.

Morrill, Dexter, "Trumpet Algorithms for Computer Composition," *Computer Music Journal* (Feb. 1977) pp. 46–52.

Samson, Peter R., "A General–Purpose Digital Synthesizer," *Journal of the Audio Engineering Society* (1980) 28(3):106–13.

Saunders, Steve, "Improved FM Audio Synthesis Methods for Real–Time Digital Music Generation," *Computer Music Journal* (Feb. 1977) pp. 53–55.

Smith, Julius O. III, Introduction To Digital Filter Theory, Report No. STAN–M–20 (Standford University, Center for Computer Research in Music and Acoustics 1985) (1981); reprinted in Digital Audio Signal Processing: An Anthology, (ed. John Strawn).

Snell, John, "Design of a Digital Oscillator Which Will Generate Up to 256 Low Distortion Sine Waves in Real Time," *Computer Music Journal* (1977) 1(1):4–25.

Wells, Thomas & Eric Vogel, The Technique Of Electronic Music, (University Stores, Inc. 1974).

"Introducing the EuPhonics Newsletter," *EuPhonics Newsletter*, vol. 1, No. 1, ¶ 3 (1993).

"Music Synthesis & Dolby AC–2 from EuPhonics," *Analog Devices DSPatch*, No. 25, pp. 9–10 (1992).

"ICASSP Exhibit Guide: Music Synthesis with Multi–dimesional Sound," *Analog Devices DSPatch*, No. 27, p. 7 (1993).

DSP 16 Plus and DSP 16 User's Manual, Cardinal Technologies, Inc., 1827 Freedom Road, Lancaster, PA 17601 1993.

METHOD AND APPARATUS FOR CREATING DIFFERENT WAVEFORMS WHEN SYNTHESIZING MUSICAL SOUNDS

This application is a file wrapper continuation of application Ser. No. 08/418,518, filed Apr. 7, 1995, now abandoned.

FIELD OF THE INVENTION

The present invention relates to a method and apparatus for creating different waveforms when synthesizing musical sounds.

BACKGROUND OF THE INVENTION

In digital music synthesis, one of the basic functional units is the phase increment oscillator. A phase increment oscillator generates a "phase sawtooth," and then employs a "waveshaper" to shape the phase sawtooth into a sine wave, or other desired waveform. In most early hardware implementations, a lookup table in RAM or ROM was used to transform the phase sawtooth into the desired waveform. That approach had the virtues of generating waveforms of arbitrary shapes and being relatively cost effective compared to other means available, at least at that time. Because of these virtues, that approach remains common today.

However, in the maturing of the digital music synthesizer, certain waveforms have become standard, thus obviating the need for arbitrary waveform generation. For example, the popular Yamaha Corporation "OPL3" synthesizer chip has eight standard waveforms. Because the "OPL3" chip is used in Creative Technology Ltd's "SOUND BLASTER" sound card for IBM-compatible PCs, the popularity of those sound cards has made those eight waveforms a standard for compatible FM music synthesis.

Additionally, in the field of VLSI, the speed of computational circuits has increased by orders of magnitude. This enables the use of computational methods of generating waveforms as an improvement (in some cases) to the lookup table methods previously used, particularly where the size of the table must be relatively large to minimize inaccuracies and distortion.

For example, the well-known Taylor expansion for the cosine function:

$$\cos(x)=1-x^2/2!-x^4/4!-x^6/6!$$

provides a basis for a computational approximation to a stored sine waveform, shifted in phase by $\pi/2$. Unfortunately, to achieve sufficient accuracy of less than a few percent total harmonic distortion (which is adequate for low cost music synthesis), several terms of this equation must be implemented when the required range is from $-\pi$ to $\pi$ (a single cycle of the cosine). Because each additional term requires an additional multiplication and addition, this approach becomes computation intensive, and thus costly.

Accordingly, while computational approaches such as these have been used instead of lookup tables, they require fairly complicated multiplications, additions and other functions. This in turn requires complex logic, if the logic is hardwired, or places a significant burden on a microprocessor, if a microprocessor is used instead. The tradeoff has been, therefore, between using large amounts of memory, as with a lookup table, or large amounts of computational capacity, as with a computational approach.

SUMMARY OF THE INVENTION

This invention provides a new circuit and method for generating waveforms from a phase angle input when synthesizing musical sounds. In one embodiment, the invention provides a multiplexer/shifter which modifies the phase angle input according to the particular waveform desired. Boolean logic gates then further modify the multiplexer/shifter output signal based on the two most significant bits of the phase angle input and according to the particular waveform desired. Finally, a multiplier multiplies the multiplexer/shifter output signal with the output signal of the Boolean logic gates to produce the desired waveform. The invention may employ banks of exclusive OR gates and AND gates as the Boolean logic.

Another embodiment of the invention provides a waveshaping method where a desired waveform is generated from a phase angle input. The phase angle input is multiplexed/shifted based on the particular waveform desired. The results of the multiplexing/shifting are then modified by Boolean logic gates, based on the two most significant bits of the phase angle input and according to the particular waveform desired. The results of the multiplexing/shifting and the Boolean logic are then multiplied together to produce the desired waveform.

BRIEF DESCRIPTION OF THE DRAWINGS

The objects, features and advantages of the present invention will be apparent to one skilled in the art in light of the following detailed description in which.

DETAILED DESCRIPTION OF THE INVENTION

Figure 1:
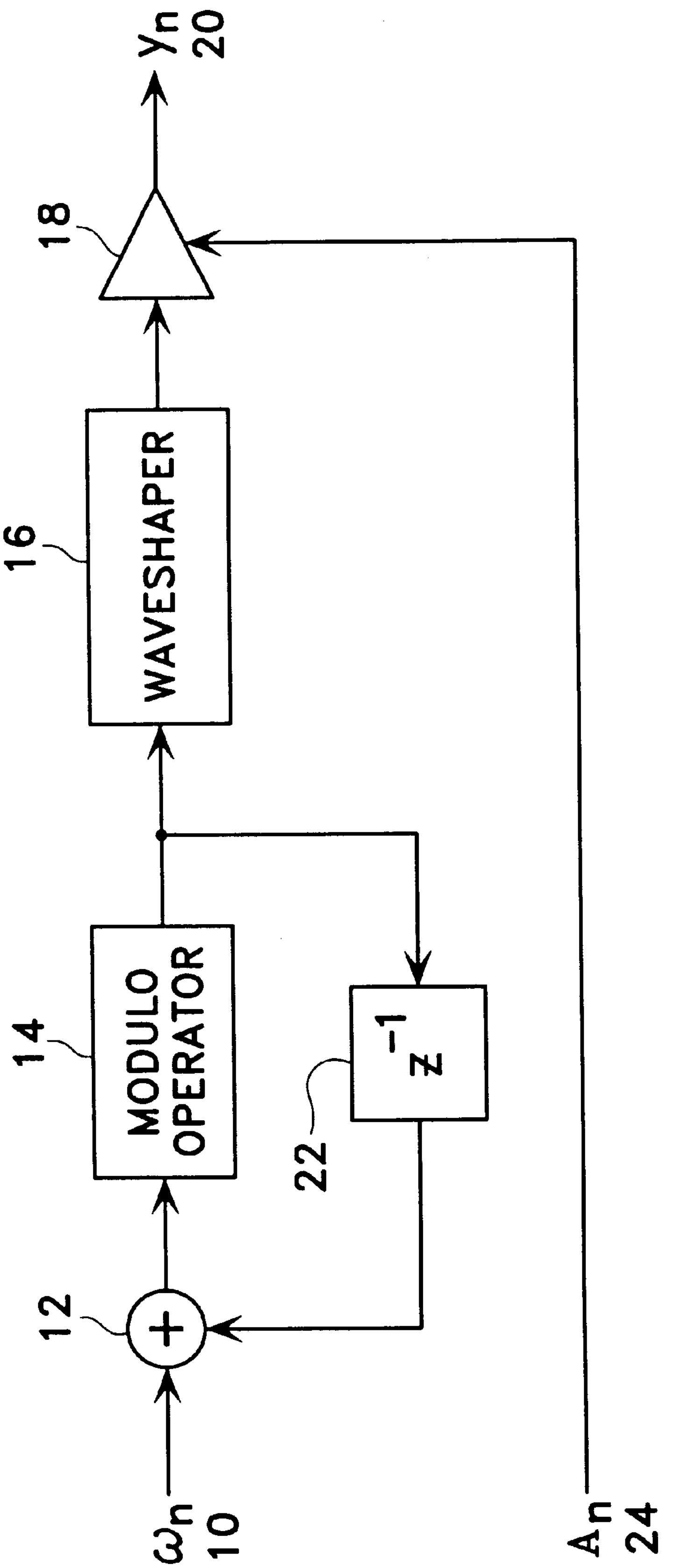
FIG. 1 (PRIOR ART)
FIG. 1 shows a signal flow diagram of a known phase increment oscillator.
Figure 2A:
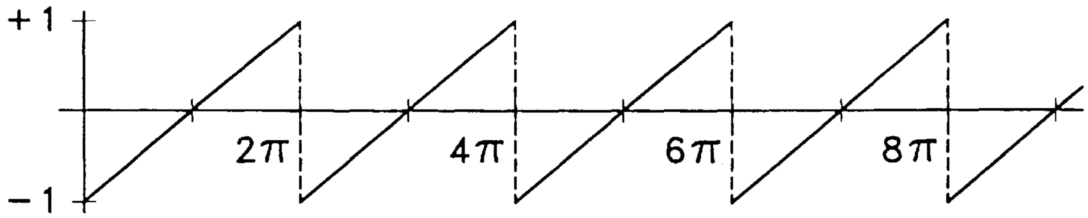
FIG. 2 shows graphically the basis of the present invention.
Figure 2B:
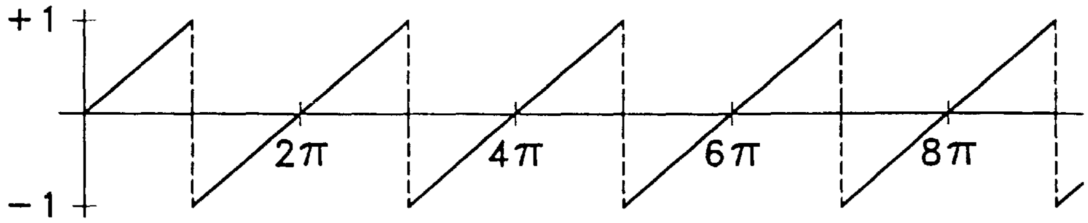
Figure 2C:
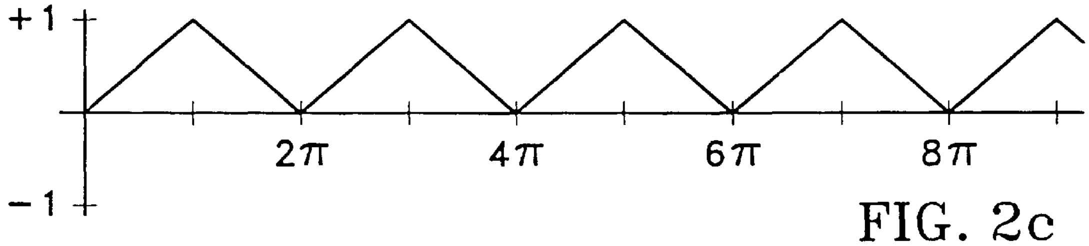
Figure 2D:
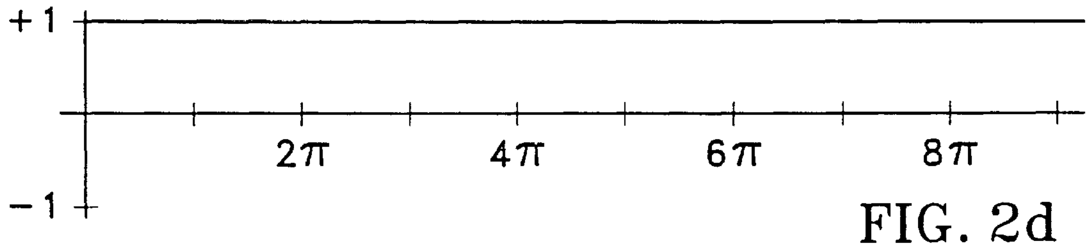
Figure 2E:
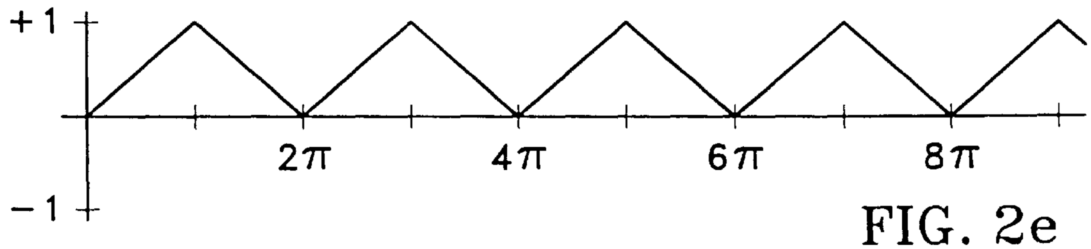
Figure 2F:
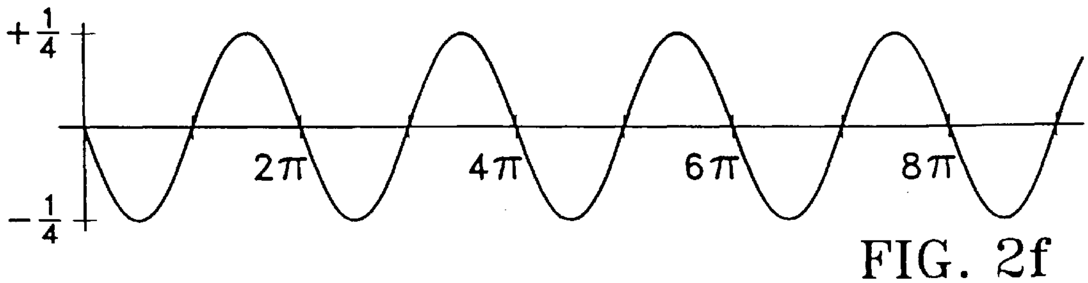

Before the present methods and apparatuses are described, it is to be understood that this invention is not limited to the particular apparatuses or methods described as such, which those of skill in the art can, of course, vary. It is also to be understood that the terminology used herein is for the purpose of describing particular embodiments only, and is not intended to be limiting as to the scope of the present invention, which will be limited only by the appended claims.

It should be noted that, as used in this specification and the appended claims, the singular forms "a", "an" and "the" include the plural referents unless the context clearly dictates otherwise.

Unless defined otherwise, all technical and scientific terms used herein have the same meaning as commonly understood by one of ordinary skill in the art to which this invention belongs. Although any methods and materials similar or equivalent to those described herein can be useful in the practice or testing of the present invention, preferred methods and materials are described below. All publications and patents mentioned herein are incorporated herein by reference.

As noted above, the Taylor expansion of the cosine function provides a basis for a computational approximation to a stored sine waveform, but it requires several terms (and the necessary multiplications and additions) to achieve sufficient accuracy through a range of $-\pi$ to $\pi$. It can be seen through analysis, however, that if the range is limited from $-\pi/2$ to $\pi/2$, that a single term of the Taylor expansion can be appropriately modified and used, using a quadratic spline method. Specifically, $$\cos(x)[-\pi/2 \leq x \leq \pi/2] \approx 1-(2x/\pi)^2$$

One can visualize this function over the specified interval as an inverted parabola, intersecting the points (−1,0), (0,1), and (1,0). One can then extrapolate to a "parabolic wave" approximation to a cosine wave based on this interval linked appropriately with other copies of the same interval, inverted and translated appropriately.

The above formula clearly requires at least one multiplication. However, it is not obvious that the remainder of the formula can be adequately approximated entirely by Boolean logic, without requiring an adder or "carry chain" logic. This means that the operation to produce this sinusoid-like waveform can be performed by a few hundred gates of logic (at the cost of a few cents on a modern VLSI circuit), plus a single multiplication operation.

Because a phase increment oscillator requires a multiplication operation for scaling of the amplitude of the output signal, a multiplier is already required in this application. With the speed of digital circuitry today, implementing a second multiplication by time domain multiplexing this multiplier does not significantly change the cost of the circuitry for many modern implementations.

Those skilled in the art will recognize from the above description that the present invention suffers from approximately 2% harmonic distortion. However, the alternative approach of a table lookup oscillator can suffer from more objectional forms of distortion when implemented for low cost by the use of a small table, because the resulting waveform will have a "stairstep" quality. This is much more objectionable than the smooth output signal that the present invention produces. Thus, the present invention, despite its distortion, has a perceived fidelity advantage over previous low cost approaches.

In short, therefore, the present invention provides an efficient, low cost alternative to waveform memory storage in producing standard waveforms from a phase increment oscillator. It also offers improved audio fidelity at low cost.

Various embodiments of the present invention are illustrated in FIGS. 1 through 5. FIG. 1 shows, in signal flow diagram form, a well known phase increment oscillator, a conventional circuit in which an embodiment of the invention can be implemented. While many variations of this oscillator exist, including in particular numerous connection topologies for implementing various FM patches, the fundamental core of the oscillator remains unchanged.

In FIG. 1, an adder 12 adds a phase increment ($\omega_n$) input 10 to the value of the previous phase, which was stored by the delay operator 22. A modulo operator 14 then takes the sum modulo $2\pi$, and the resulting new phase is output to both a waveshaper 16 and to the delay operator 22, which stores it for use during the computation of the next sample. A multiplier 18 then multiplies the output signal of the waveshaper 16 by an amplitude envelope ($A_n$) input 24 to produce the oscillator's output signal ($Y_n$) 20.

As will be easily seen by those skilled in the art, when the phase increment ($\omega_n$) input 10 is a constant much less than $2\pi$, the signal at the output of the modulo operator 14 will be a "sawtooth" waveform increasing slowly with constant slope from zero to $2\pi$, then jumping suddenly back to zero to begin rising again. Hence this signal is commonly referred to as a "phase sawtooth." This is shown graphically in row 2*a* of FIG. 2.

The present invention performs the function of the waveshaper 16 in FIG. 1. FIG. 2 shows pictorially the generation, according to the present invention, of an inverted sine waveform. Although for clarity the example of a standard phase sawtooth being input to the waveshaper 16 is sometimes used in the detailed description of the present invention, it will be evident to those skilled in the art that the phase angle input need not be limited to a standard phase sawtooth; any phase angle input may be used.

Row 2*a* of FIG. 2 shows several cycles of the standard phase sawtooth, with time varying over the horizontal axis and amplitude varying from −1 to +1 on the vertical axis. Note that the vertical axis has been scaled and a fixed offset added to the standard view of the phase sawtooth varying from 0 to $2\pi$; this is of course of no audible consequence.

Row 2*b* shows the standard phase sawtooth with a phase offset of $\pi$ added to it. In other words, the phase sawtooth has been shifted 180 degrees along the horizontal axis. Row 2*c* shows the absolute value of the signal in FIG. 2*b*. Row 2*d* shows the signal, in this case simply y(t)=1, which according to the present invention is to be ANDed with Row 2*c*. Row 2*e* shows the results of that ANDing. Finally, Row 2*f* shows the end results of the present invention, obtained by multiplying the signal in Row 2*a* with that in Row 2*e*, which can be seen to approximate an inverted sine waveform of amplitude ranging from −¼ to ¼. This is an inverted form of the first standard "OPL3" waveform, obtained according to the present invention.

Figures 3A, 3B, 3C, 3D, 3E, 3F:
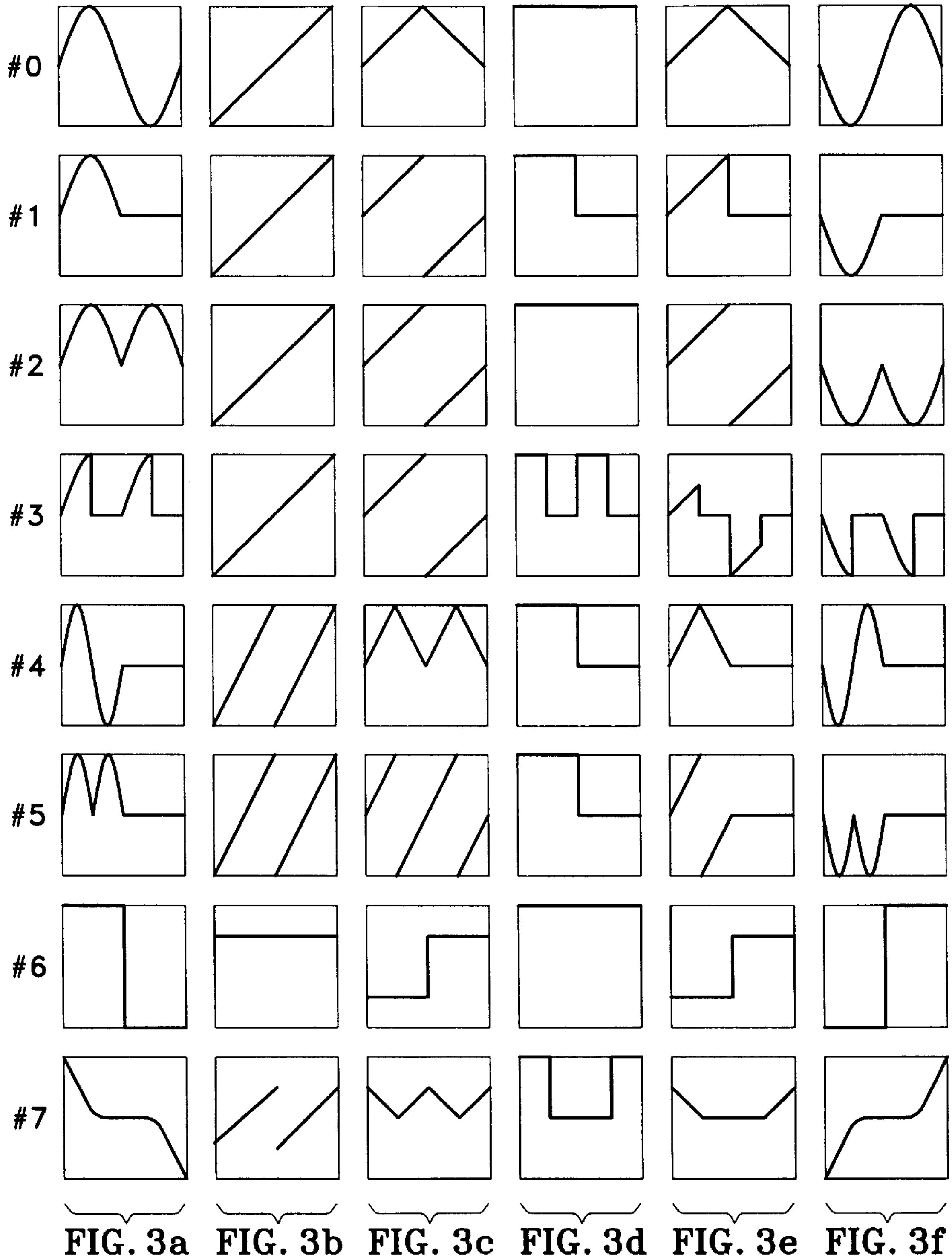
FIG. 3 shows graphically the creation of the eight "OPL3" waveforms using the present invention.

FIG. 3 shows pictorially the method, according to the present invention, for forming each of the eight standard "OPL3" waveforms (Waveforms #0 to #7). Each of the steps of the method shown pictorially in FIG. 3 will be discussed in greater detail below when describing the operation of the hardware embodiment of the present invention.

Column 3*a* of FIG. 3 shows one cycle, from $\pi$ to $+\pi$, of each of the eight waveforms. Column 3*b* shows the first modification, if any, to the input phase sawtooth required by the present invention. This first modification results in either the original phase sawtooth (for Waveforms #0 to #3), the original phase sawtooth doubled in frequency (for Waveforms #4 and #5), and in one case, also halved in amplitude (for Waveform #7), or the signum of the original phase sawtooth, also halved in amplitude (for Waveform #6).

Column 3*c* shows the modified phase sawtooth shifted in phase, if required, and its absolute value taken, if required, in both cases according to the present invention. Column 3*d* shows the function which, according to the present invention, is ANDed with the modified phase sawtooth of column 3*c*, and column 3*e* shows the results of the ANDing of columns 3*c* and 3*d*. Finally, column 3*f* shows the results of the final step of the present invention, multiplying column 3*b* by column 3*e*. Note that the vertical scale of column 3*e* is from −¼ to ¼, while the vertical scale of the other columns is −1 to 1.

From FIG. 3, it can be seen that all eight "OPL3" waveforms can be approximated according to the present invention. This is accomplished by appropriately combining, according to the present invention, the steps of modifying the original phase sawtooth input, shifting the result in phase, taking an absolute value, ANDing the result with certain phase sawtooth bits, and finally a single multiplication. Note that the polarity of the approximated waveforms is treated as being insignificant, as it does not affect the sound or harmonic content of the waveform. However, as will be seen below, with minor modifications to the circuitry described even the polarity can be corrected, if desired.

Figure 4:
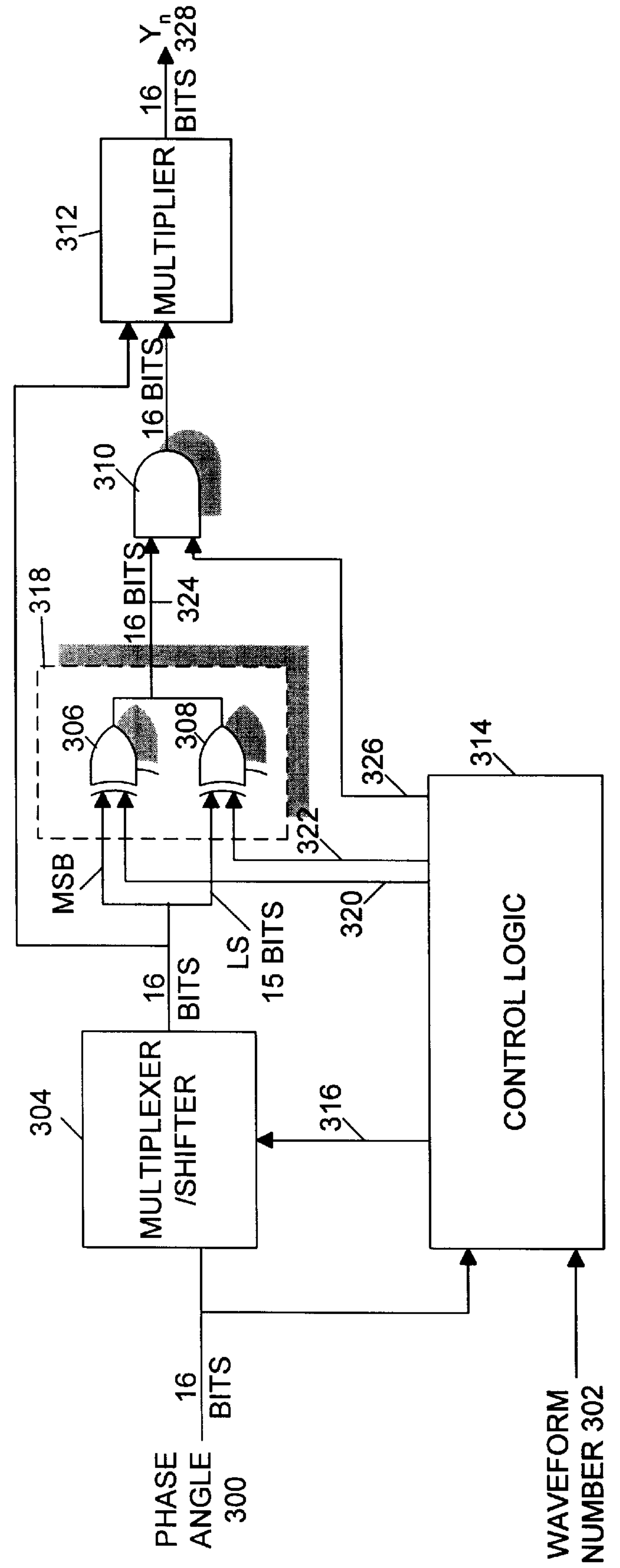
FIG. 4 shows a block diagram of a hardware implementation of the present invention.

FIG. 4 shows a detailed hardware implementation of the present invention. A phase angle input 300 provides an input to both a multiplexer/shifter 304 and control logic 314.

The multiplexer/shifter 304 is a multiplexer wired as a modified barrel shifter. The control logic 314 drives the multiplexer/shifter 304 through a control signal 316. In this embodiment, the control signal has two bits for representing the four possible multiplexer/shifter functions. However, as will be evident to those skilled in the art, the control signal 316 can have more than two bits if desired to optimize the logic of the circuit.

The steps for generating each of the standard "OPL3" waveforms will now be described. First, the multiplexer/shifter 304 operates on the phase angle input 300, as described in detail below. The output signal of the multiplexer/shifter 304 for each waveform is shown in column 3*b* of FIG. 3.

In FIG. 4, when the control logic 314 sends a control signal 316 of binary 00 to the multiplexer/shifter 304, the multiplexer/shifter 304 outputs a 16-bit signal identical to the 16-bit phase angle input 300 it received. This produces the output signal shown in rows #0 to #3 of column 3*b* of FIG. 3.

When the control signal 316 to the multiplexer/shifter 304 is binary 01, it shifts the 16-bit phase angle input 300 left one bit, shifts off and ignores the most significant bit ("MSB"), sets the new least significant bit ("LSB") to 0, and inverts the new MSB. Mathematically, this is equivalent to adding $\pi/2$ to the phase angle input 300, multiplying the result by two, and then taking the result modulo $\pi/2$. This produces the output signal shown in rows #4 and #5 of column 3*b*.

When the control signal 316 to the multiplexer/shifter 304 is binary 10, it outputs a fixed hexadecimal 3FFF. This produces the output signal shown in row #6 of column 3*b*.

Finally, when the control signal 316 to the multiplexer/shifter 304 is binary 11, it outputs the fourteen LSBs of the 16-bit phase angle input 300 unchanged, and sets the two MSBs of the output signal both to the inverse of the next to the most significant bit, i.e. bit 14, of the original input signal. In other words, it outputs the fifteen LSBs of the 16-bit phase angle input 300 plus $\pi/2$, sign extended. This produces the output signal shown in row #7 of column 3*b*.

Next, a bank 318 of exclusive OR gates further modifies the 16-bit output signal of the multiplexer/shifter 304. The exclusive OR bank 318 consists of two sections. The first section of exclusive OR gates 306 acts only on the MSB of the multiplexer/shifter 304 output signal, while the second section of exclusive OR gates 308 acts on the other fifteen LSBs.

The exclusive OR bank 318 performs two functions, phase shifting and a functional approximation to the absolute value function, or a combination of both, or neither (a pass-through). The output signal of the exclusive OR bank 318 for each waveform is shown in column 3*c* of FIG. 3.

When two control signals 320 and 322 received by both sections of the exclusive OR bank 318 are both logical "0", no change occurs. This pass-through operation is used to produce part of the output signal shown in rows #6 and #7 of column 3*c* of FIG. 3.

When the first control signal 320 is logical "0" and the second control signal 322 is logical "1", the output signal 324 of the exclusive OR bank 318 is the one's complement of the multiplexer/shifter 304 output signal plus $\pi$. In this case, the one's complement is only one LSB away from the two's complement, which is, to the accuracy required, the same result as obtained by multiplying by $-1$. Accordingly, taking the one's complement can be used to produce a functional approximation to the absolute value function. This phase-shifting and absolute value operation is used to produce part of the output signal shown in rows #0 and #4 of column 3*c*.

When the first control signal 320 is a logical "1" but the second control signal 322 is a logical "0", the output signal 324 of the exclusive OR bank 318 is the sum of the multiplexer/shitter 304 output signal and $\pi$, since the MSB has significance $\pi$. Accordingly, this operation can be used to shift a signal by $\pi$. This operation is used to produce all of the output signal shown in rows #1, #2, #3 and #5 of column 3*c*, and part of the output signal shown in rows #0 and #4.

When the two control signals 320 and 322 are both a logical "1", the output signal 324 of the exclusive OR bank 318 is the one's complement of the output signal of the multiplexer/shifter 304. As discussed above, this operation is a functional approximation to the absolute value function. This operation is used to produce part of the output signal shown in rows #6 and #7 of column 3*c* of FIG. 3.

Next, a bank 310 of AND gates further modifies the 16-bit output signal 324 of the exclusive OR bank 318. A control signal 326 to the AND bank 310 can force its 16-bit output signal to hexadecimal 0000, or leave it unchanged. This performs the ANDing of each of the signals shown in column 3*c* of FIG. 3 with the corresponding signal shown in column 3*d*, with the output signal of the bank 310 for each waveform shown in column 3*e*.

It should be noted that all of the Boolean logic described up to this point is parallel in nature, and does not require any addition operations or other logic, such as a carry chain, that requires each higher order bit to be processed as a result of logical operations on lower order bits. Thus, the processing of this data involves only a few gate delays and can be accomplished within a single clock cycle.

A 16-bit by 16-bit signed two's complement multiplier 312 then receives both the 16-bit output signal of the multiplexer/shifter 304, unmodified (as shown in column 3*b* of FIG. 3), and the 16-bit output signal of the AND bank 310 (as shown in column 3*e*), and multiplies them together. Because most current audio applications use just 16-bit signals, only the sixteen MSBs of the multiplier 312 output signal are needed, so an abbreviated form of the multiplier can be used. The results of this multiplication for each waveform are shown in column 3*f* of FIG. 3. This completes the processing needed to form each of the standard "OPL3" waveforms.

As will be evident to those skilled in the art, depending on the size of the available multiplier, it may be desirable to have either or both of the arguments of the multiplier be less than 16 bits, since that would have only a minor impact on the waveform fidelity. Moreover, it will also be evident that any type of multiplier could be used, such as a full parallel multiplier, a serial multiplier, or a hybrid parallel/serial multiplier, to accomplish this function.

In addition, the multiplier 312 output signal never reaches more than one fourth of its theoretical maximum output value, since the peak values occur when its inputs are each at an absolute value of half of full scale. The multiplier 312 output signal 328 should be scaled to account for this.

As is evident from the above step-by-step description, the four control signals 316, 320, 322 and 326 output by the control logic 314 must be set appropriately to form the eight "OPL3" waveforms. These control signals 316, 320, 322 and 326 are determined by the waveform number 302 and the two MSBs of the phase angle input 300. These control signals 316, 320, 322 and 326 then appropriately control the multiplexer/shifter 304, the exclusive OR bank 318, the AND bank 310 and the multiplier 312 to create the desired waveform from the phase angle input 300.

Based on the waveform number 302 and bits 15 and 14 of the phase angle input 300, the control logic 314 sets the control signals 316, 320, 322 and 326 to the values shown in the truth table, Table 1, below. In Table 1, PHn indicates the nth bit of the phase angle input 300, so that, for example, PH15 is the most significant bit. ! indicates logical complement, and ^ indicates an exclusive OR.

TABLE 1

Control Signal Truth Table

| Waveform | Control Signals: | | | |
|---|---|---|---|---|
| Number | 316 | 320 | 322 | 326 |
| #0 | 00 | PH15 | !PH15 | 1 |
| #1 | 00 | 1 | 0 | PH15 |
| #2 | 00 | 1 | 0 | 1 |
| #3 | 00 | 1 | 0 | !PH14 |
| #4 | 01 | PH14 | PH14 | PH15 |
| #5 | 01 | 1 | 0 | PH15 |
| #6 | 10 | PH15 | PH15 | 1 |
| #7 | 11 | !PH14 | !PH14 | PH15^PH14 |

Figures 5A, 5B, 5C, 5D:
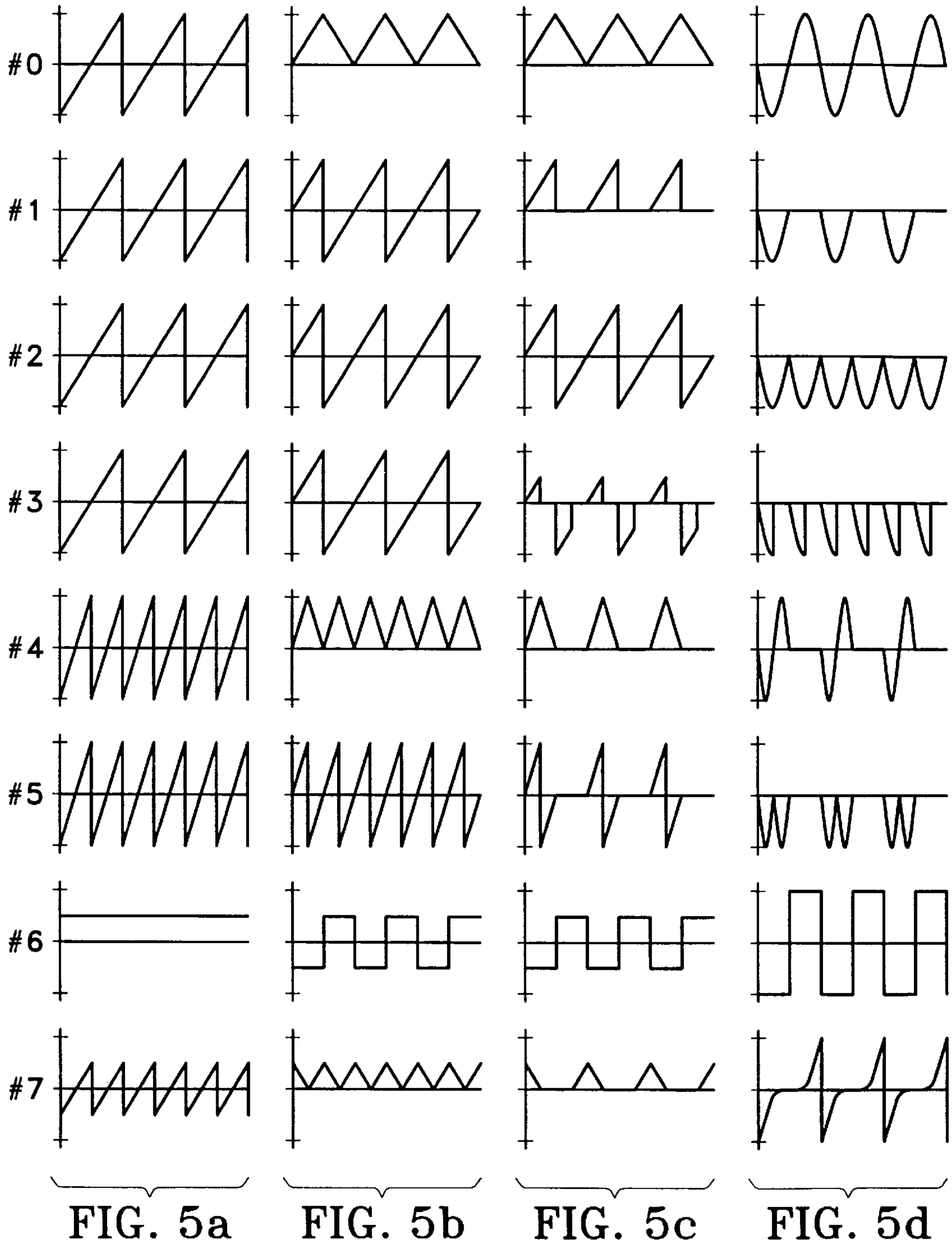
FIG. 5 shows the relationship of signals in the present invention for the eight "OPL3" waveforms.

FIG. 5 shows in graphical form the various steps, described in detail above, for producing each of the eight "OPL3" waveforms. Column 5*a* shows the output signal of the multiplexer/shifter 304, column 5*b* shows the output signal 324 of the exclusive OR bank 318, column 5*c* shows the output signal of the AND bank 310, and column 5*d* shows the output signal 328 of the multiplier 312. Note that the vertical scale of column 5*d* is from −¼ to ¼, while the vertical scale of the other columns is −1 to 1.

As can be seen in column 3*f* of FIG. 3 and column 5*d* of FIG. 5, all of the output waveforms, when created as described above, are simply inverted in polarity from the desired "OPL3" waveforms. Inverted polarity has no audible impact on the sounds of these waveforms. However, the precise waveform, correct in phase and polarity, can be produced by taking the complement of the output waveform. This can be done at a variety of locations in further signal processing circuitry, as part of the multiplier 312, or by an additional circuit. As will be evident to those skilled in the art, a one's complementing of the output signal may be sufficient to accomplish this inversion to the accuracy of the approximations herein described.

FIG. 4 provides circuitry, or hardware, which embodies the invention. However, as will be evident to those skilled in the art, the invention can also be embodied in firmware and software.

As can be seen from the detailed description of the present invention above, it enables each of the standard "OPL3" waveforms to be produced without requiring large amounts of memory or intensive computation. Accordingly, for applications where the waveform can be an approximation, and high accuracy in the waveform is not required, the waveshaper of the present invention provides advantages over the prior art.

What is claimed is:

1. A circuit for generating a waveform from a phase angle input having a plurality of bits, the circuit comprising:

a multiplexer producing a first output having a plurality of bits, wherein the multiplexer receives the phase angle input and the control signal such that, based on the control signal, the multiplexer either passes through, shifts, inverts or logically forces to zero or one each bit of the phase angle input to produce the first output;

combinatorial logic circuitry coupled to said multiplexer to receive the first output, said combinatorial logic circuitry producing a second output by performing Boolean operations on each bit of the first output; and a multiplier coupled to said multiplexer and the combinatorial logic circuitry to receive said first output and said second output, said multiplier multiplying the first output with the second output to produce the waveform.

2. The circuit of claim 1 wherein the combinatorial logic circuitry comprises a plurality of exclusive OR gates and a plurality of AND gates.

3. The circuit of claim 2 wherein the plurality of AND gates operate on an output of the plurality of exclusive OR gates.

4. A method for generating a waveform from a phase angle input having a plurality of bits, the method comprising the steps of:

according to control signals that determine the waveform, operating on each bit of the phase angle input by either passing through, shifting, inverting or logically forcing to zero or one the each bit of the phase angle input to produce a first output having a plurality of bits;

performing Boolean operations on each bit of the first output resulting from the operating step to produce a second output having a plurality of bits; and multiplying the first output resulting from the operating step and the second output resulting from the performing step to produce the waveform.

5. A method for generating a waveform from a phase angle input having a plurality of bits, the method comprising the steps of:

according to control signals that depend on the waveform, operating on each bit of the phase angle input by either passing through, shifting, inverting or logically forcing to zero or one, the each bit of the phase angle input to produce a first output having a plurality of bits;

performing Boolean operations on each bit of the first output resulting from the operating step, without performing an addition operation or any operation which requires a carry chain to produce a second output having a plurality of bits; and multiplying the first output resulting from the operating step and the second output resulting from the performing step to produce the waveform.

6. A circuit for generating waveforms based on phase angle input signals, each phase angle input signal represented by a number of input bits, said circuit comprising:

(a) a first combinatorial logic circuit for receiving a phase angle input signal to produce a first output signal by changing a value of at least one input bit of the phase angle input signal such that the first output signal includes an output bit whose value equals the value of the at least one input bit after it has been changed, or passing through all input bits unchanged such that the first output signal has output bits whose values equal values of said input bits;

(b) a second combinatorial logic circuit for receiving said first output signal to produce a second output signal by performing at least one Boolean operation on the first output signal; and (c) a multiplier for multiplying the first and second output signals to produce a selected waveform.

7. The circuit of claim 6 wherein the second combinatorial logic circuit comprises a plurality of exclusive OR gates and a plurality of AND gates.

8. The circuit of claim 7 wherein the plurality of AND gates operates on an output of the plurality of exclusive OR gates.

9. A circuit for generating waveforms from phase angle input signals, each phase angle input signal represented by a number of input bits, said circuit comprising:

(a) a first combinatorial logic circuit receiving a phase angle input signal and a control signal, said control signal causing said first combinatorial logic circuit to perform a first set of Boolean operations on the phase angle input signal to produce a first output signal;

(b) a second combinatorial logic circuit receiving said first output signal to produce a second output signal by performing a second set of Boolean operations on the first output signal; and (c) a multiplier multiplying the first and second output signals to produce a selected waveform.

10. The circuit of claim 9 wherein the second combinatorial logic circuit comprises a plurality of exclusive OR gates and a plurality of AND gates.

11. The circuit of claim 10 wherein the plurality of AND gates operate on an output of the plurality of exclusive OR gates.

12. A waveshaper of a phase increment oscillator, said waveshaper comprising:

(a) a first combinatorial logic circuit receiving a phase angle input having a plurality of phase input bits and a control signal, said control signal causing said first combinatorial logic circuit to modify a set of the phase input bits to produce a first output signal;

(b) a second combinatorial logic circuit coupled to said first combinatorial logic circuit to receive said first output signal, said second combinatorial logic circuit producing a second output signal by performing Boolean operations on the first output signal; and (c) a multiplier coupled to said first and second combinatorial logic circuits to receive said first and second output signals, said multiplier multiplying said output signals to produce a waveform identified by said control signals, wherein each waveform value corresponds to a particular phase angle input value.

13. The circuit of claim 12 wherein the second combinatorial logic circuit comprises a plurality of exclusive OR gates and a plurality of AND gates.

14. The circuit of claim 13 wherein the plurality of AND gates operate on an output of the plurality of exclusive OR gates.

15. A circuit for generating a waveform based on a phase angle input signal and a waveform selection input signal, said circuit comprising:

(a) control logic producing control signals from the waveform selection input signal and a set of bits of the phase angle input signal;

(b) a multiplexer/shifter coupled to said control logic, said multiplexer/shifter responsive to said control signals and said phase angle input signal to produce a first output signal having a plurality of bits, each bit of said first output signal dependent only on at most one bit of said phase angle input signal and on said control signals;

(c) a combinatorial logic circuit coupled to said control logic and said multiplexer/shifter to receive said control signals and said first output signal produced by said multiplexer/shifter, said combinatorial logic circuit producing a second output signal having a plurality of bits, each bit of said second output signal depending exclusively on a bit in said first output signal and on said control signals; and (d) a multiplier multiplying said first output signal with said second output signal to produce said waveform.

16. A method of generating waveforms from phase angle input signals, each phase angle input signal represented by a number of input bits, said method comprising the steps of:

(a) receiving a phase angle input signal;

(b) receiving a control signal;

(c) based on said control signal, generating a first output signal by (i) changing a value of at least one input bit of the phase angle input signal such that the first output signal includes an output bit whose value equals the value of the at least one input bit after it has been changed, or (ii) passing through all phase input bits unchanged such that the first output signal has output bits whose values equal values of said input bits;

(d) generating a second output signal by performing Boolean operations on said first output signal; and (e) generating a selected waveform by multiplying the first and second output signals.

* * * * *